(12) United States Patent
He et al.

(10) Patent No.: US 12,363,849 B2
(45) Date of Patent: Jul. 15, 2025

(54) SERVER

(71) Applicants: SQ Technology (Shanghai) Corporation, Shanghai (CN); INVENTEC CORPORATION, Taipei (TW)

(72) Inventors: Fanpu He, Shanghai (CN); Jiaqi Yuan, Shanghai (CN); Xiu-Hua Zhao, Shanghai (CN)

(73) Assignees: SQ Technology (Shanghai) Corporation, Shanghai (CN); INVENTEC CORPORATION, Taipei (TW)

( * ) Notice: Subject to any disclaimer, the term of this patent is extended or adjusted under 35 U.S.C. 154(b) by 302 days.

(21) Appl. No.: 17/839,741

(22) Filed: Jun. 14, 2022

(65) Prior Publication Data
US 2023/0276593 A1    Aug. 31, 2023

(30) Foreign Application Priority Data
Feb. 28, 2022    (CN) .......................... 202210188982.6

(51) Int. Cl.
| | |
|---|---|
| H05K 7/00 | (2006.01) |
| H05K 5/02 | (2006.01) |
| H05K 7/14 | (2006.01) |
| H05K 7/20 | (2006.01) |

(52) U.S. Cl.
CPC ......... *H05K 7/1487* (2013.01); *H05K 5/0286* (2013.01); *H05K 7/1489* (2013.01); *H05K 7/20172* (2013.01); *H05K 7/1485* (2013.01)

(58) Field of Classification Search
CPC .. H05K 7/1487; H05K 5/0286; H05K 7/1489; H05K 7/20172; H05K 7/1485
See application file for complete search history.

(56) References Cited

U.S. PATENT DOCUMENTS

| | | | |
|---|---|---|---|
| 11,129,303 B1* | 9/2021 | Bhatia | ................ H05K 7/20154 |
| 2020/0015386 A1* | 1/2020 | Gupta | .................. H05K 7/1401 |
| 2022/0087063 A1* | 3/2022 | Shih | .......................... G06F 1/20 |

OTHER PUBLICATIONS

CN 104516450A; English translation; published on Apr. 15, 2015 (Year: 2015).*

* cited by examiner

*Primary Examiner* — Pete T Lee
(74) *Attorney, Agent, or Firm* — troutman pepper locke; Tim Tingkang Xia, Esq.

(57) ABSTRACT

A server includes a casing, a first disk drive assembly, a fan assembly, a host assembly, a first expansion card assembly, a second expansion card assembly, a power supply assembly, and a second disk drive assembly. The casing has a first to third space. The second space is located between the first and third space. The first disk drive assembly, the fan assembly, and the host assembly are respectively located in the first to third space. The first and second expansion card assembly are located in the third space and above the host assembly. The power supply assembly is located in the third space. The second expansion card assembly is located between the first expansion card assembly and the power supply assembly. The second disk drive assembly is located in the third space and located between the power supply assembly and the second expansion card assembly.

9 Claims, 4 Drawing Sheets

SERVER

CROSS-REFERENCE TO RELATED APPLICATIONS

This non-provisional application claims priority under 35 U.S.C. § 119(a) on Patent Application No(s). 20221018982.6 filed in China, on Feb. 28, 2022, the entire contents of which are hereby incorporated by reference.

BACKGROUND OF THE INVENTION

Technical Field of the Invention

The invention relates to a server, more particularly to a server which has improved space arrangements for electronic assembly.

Description of the Related Art

As technology progress, a server is widely used for processing business in various fields. The server generally includes a motherboard, a power supply, various types of disk drives, and so on.

In order to provide consumers with better service quality, various manufacturers are urgent to improve the performance of their servers. The performance of a server is related to the number of electronic components inside the server. If the number of electronic components inside the server increases, the performance of the server will be improved. However, since internal space of the server is finite, how to further increase the number of electronic components inside the server to improve the performance of the server will be one of the crucial topics for the manufacturers.

SUMMARY OF THE INVENTION

The invention provides a server which is capable of accommodating electronic components as much as possible for increasing the performance thereof One embodiment of the invention provides a server. The server includes a casing, a first disk drive assembly, a fan assembly, a host assembly, a first expansion card assembly, a second expansion card assembly, a power supply assembly, and a second disk drive assembly. The casing has a first accommodation space, a second accommodation space, and a third accommodation space. The second accommodation space is located between the first accommodation space and the third accommodation space. The first disk drive assembly is located in the first accommodation space. The fan assembly is located in the second accommodation space. The host assembly is located in the third accommodation space. The first expansion card assembly and the second expansion card assembly are located in the third accommodation space and located above the host assembly. The power supply assembly is located in the third accommodation space. The second expansion card assembly is located between the first expansion card assembly and the power supply assembly. The second disk drive assembly is located in the third accommodation space. The second disk drive assembly is located between the power supply assembly and the second expansion card assembly.

According to the server as discussed in the above embodiment, the casing has three spaces, and those spaces respectively accommodate the first disk drive assembly, the fan assembly, the host assembly, the expansion card assemblies, the power supply assembly, and the second disk drive assembly, such that the server provides a desirable performance.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
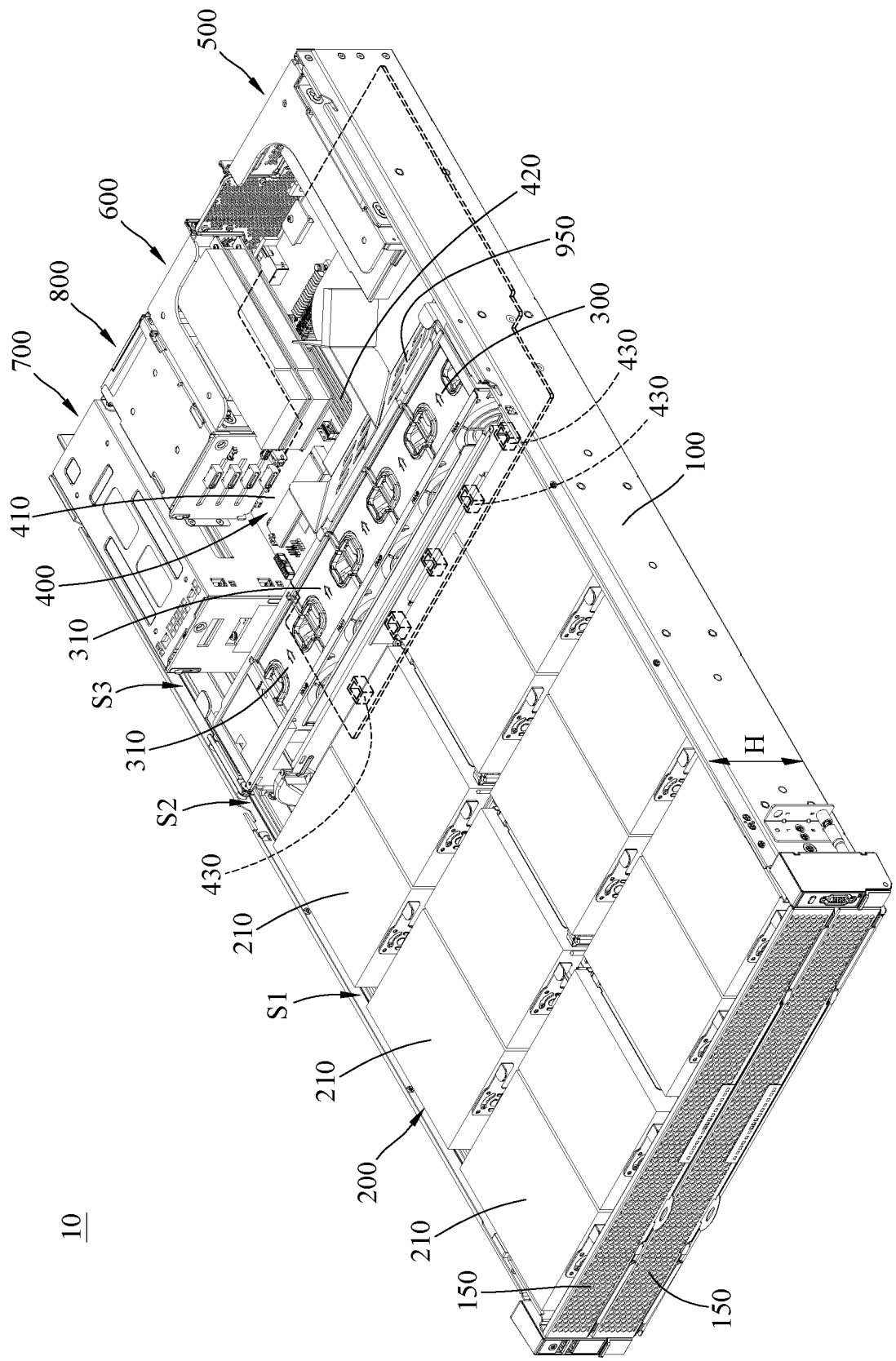
FIG. 1 is a perspective view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
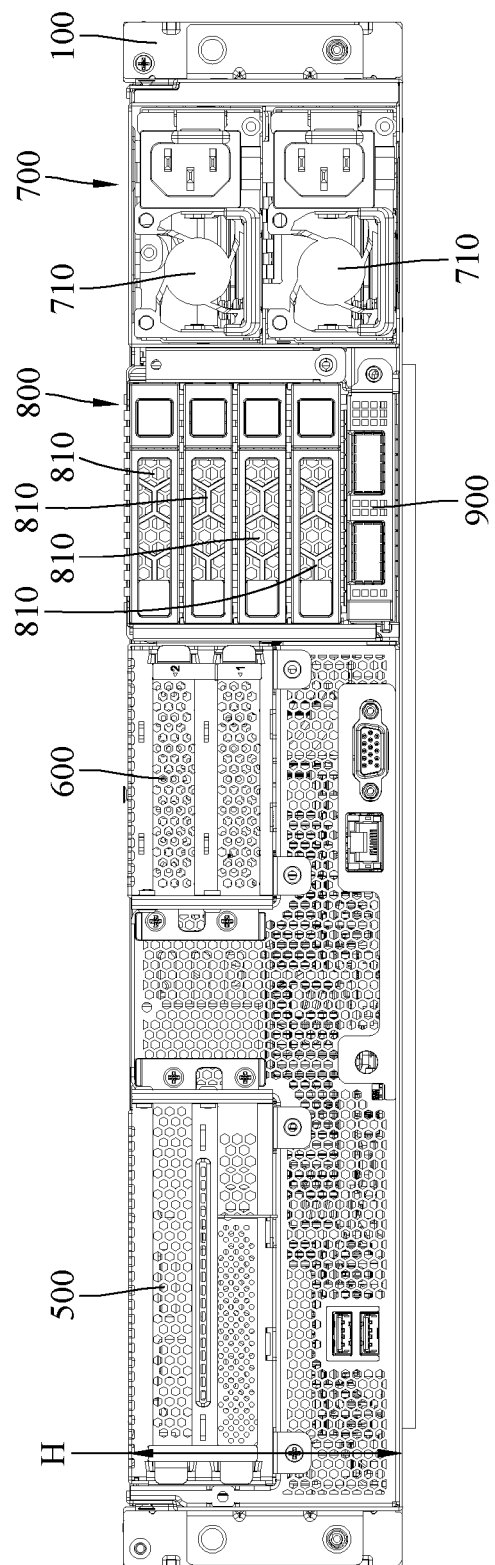
FIG. 2 is a side view of the server in FIG. 1.
Figure 3:
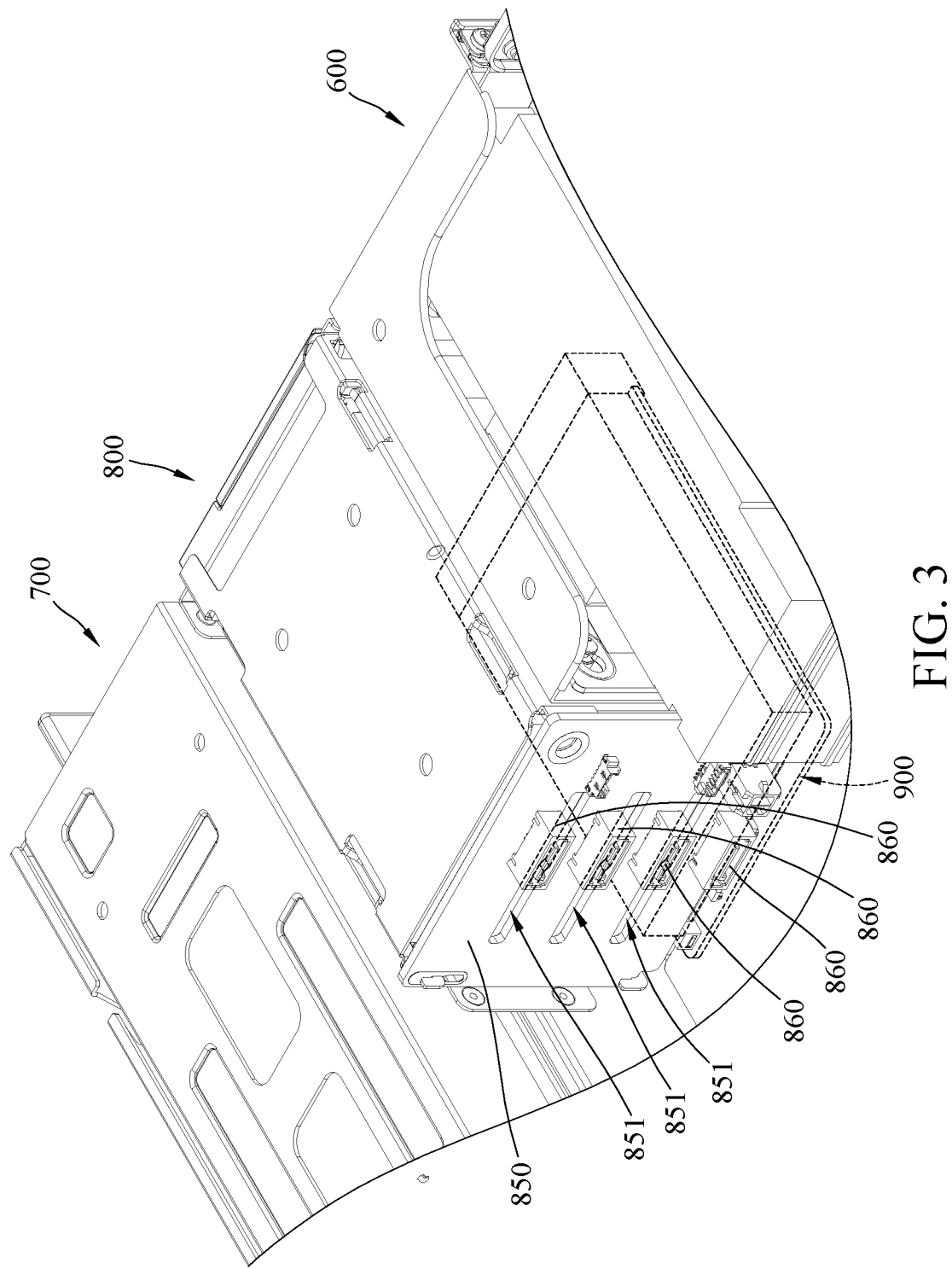
FIG. 3 is a partial perspective view of the server in FIG. 1.
Figure 4:
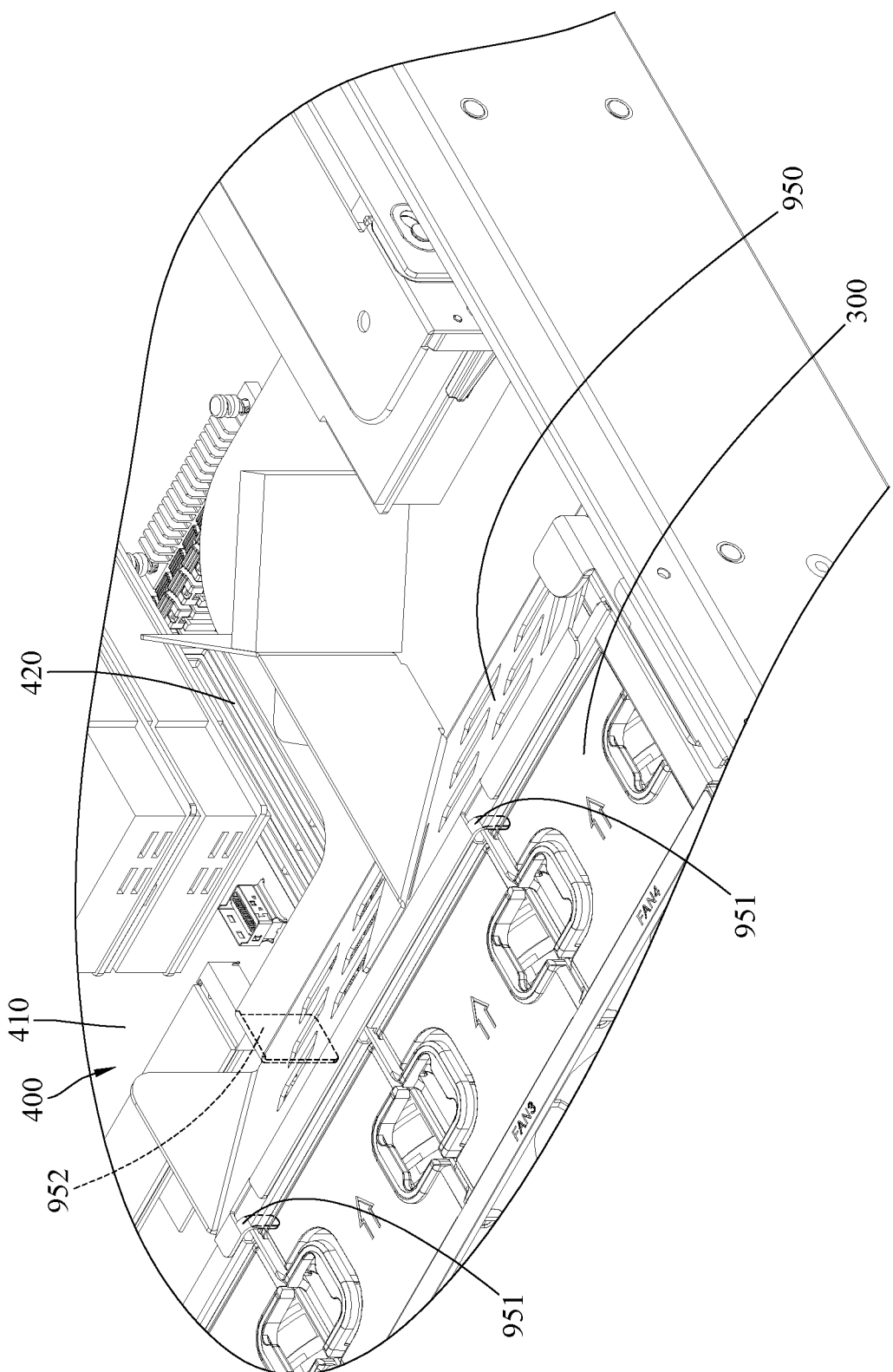
FIG. 4 is another partial perspective view of the server in FIG. 1.

Refer to FIGS. 1 to 4, where FIG. 1 is a perspective view of a server 10 according to one embodiment of the invention, FIG. 2 is a side view of the server 10 in FIG. 1, FIG. 3 is a partial perspective view of the server 10 in FIG. 1, and FIG. 4 is another partial perspective view of the server 10 in FIG. 1.

In this embodiment, the server 10 includes a casing 100, a first disk drive assembly 200, a fan assembly 300, a host assembly 400, a first expansion card assembly 500, a second expansion card assembly 600, a power supply assembly 700, and a second disk drive assembly 800. In addition, the server 10 may further include two trays 150.

A height H of the casing 100 is 2U; that is, the server 10 is a 2U server. The casing 100 has a first accommodation space S1, a second accommodation space S2, and a third accommodation space S3. The second accommodation space S2 is located between the first accommodation space S1 and the third accommodation space S3. The trays 150 are disposed in the first accommodation space S1 of the casing 100 via, for example, guide rails (not shown), such that the trays 150 are slidably located in the first accommodation space S1 of the casing 100.

The first disk drive assembly 200 is located in the first accommodation space S1. Specifically, the first disk drive assembly 200 includes twenty-four 3.5-inch hard disk drives 210, and the 3.5-inch hard disk drives are arranged in two layers. Each of the two layers includes twelve 3.5-inch hard disk drives 210, and the 3.5-inch hard disk drives 210 of the two layers are respectively disposed on the two trays 150, such that the 3.5-inch hard disk drives 150 of each layer can be drawn out of the casing 100 via the tray 150.

The fan assembly 300 is located in the second accommodation space S2 and, for example, include five fans 310. The fans 310 are configured to generate airflows to dissipate heat generated from electronic components in the casing 100.

Note that the quantity of the fan 310 of the fan assembly 300 is not restricted in the invention and may be modified to be three or another number in some other embodiments.

The host assembly 400 is located in the third accommodation space S3 and includes a circuit board 410, a plurality of electronic components 420, and a plurality of fan connectors 430. The electronic components 420 are disposed on the circuit board 410. The fan connectors 430 are disposed on the circuit board 410. In this embodiment, the electronic components 420 and the fan connectors 430 are integrated on the same circuit board 410, such that the single circuit board 410 not only facilitates the maintenance, but also allows flexible arrangements of components as required due to the increased size of the circuit board 410.

The first expansion card assembly 500 and the second expansion card assembly 600 are located in the third accommodation space S3 and located above the host assembly 400. The first expansion card assembly 500, for example, includes at least one full-height expansion card, and the second expansion card assembly 600, for example, includes at least one half-height expansion card, which meets the most of requirements in the present market. In addition, the first expansion card assembly 500 and the second expansion card assembly 600 are mounted in the casing 100 via brackets of the same type, which saves the cost in producing different types of the brackets.

The power supply assembly 700 is located in the third accommodation space S3. The second expansion card assembly 600 is located between the first expansion card assembly 500 and the power supply assembly 700. The power supply assembly 700 includes two backup power supplies 710, and the backup power supplies 710 are stacked on each other. When one of the backup power supplies 710 fails, the other one of the backup power supplies 710 can still provide emergency power, such that the server 10 can be applied in important occasions, such as a bank or a military office.

The second disk drive assembly 800 is located at the third accommodation space S3 and includes four U.2 disk drives 810. The second disk drive assembly 800 is located between the power supply assembly 700 and the second expansion card assembly 600.

In this embodiment, the server 10 may further include an adapter circuit board 850 and a plurality of adapter connectors 860. The adapter circuit board 850 is mounted on the second disk drive assembly 800 and has a plurality of through holes 851. The through holes 851 are in, for example, an irregular shape. For example, widths of two opposite sides of each through hole 851 are different from each other. The through holes 851 are configured for the airflows to pass therethrough, which increases the heat dissipation efficiency of the airflows to the second disk drive assembly 800. The adapter connectors 860 are disposed on one side of the adapter circuit board 850 located away from the second disk drive assembly 800 for electrically connecting with the circuit board 410 of the host assembly 400 via cables (not shown).

In this embodiment, the server 10 may further include a network interface card assembly 900. The network interface card assembly 900, for example, includes at least one OCP3.0 network interface card and located in the third accommodation space S3. In this embodiment, the network interface card assembly 900 is, for example, located below the second disk drive assembly 800, such that there are four U.2 disk drives 810 and one OCP3.0 network interface card in the casing 100 of the finite height H.

Note that the type of the network interface card of the network interface card assembly 900 is not restricted in the invention and may be modified as required; in some other embodiments, the network interface card of the network interface card assembly 900 may be OCP2.0 network interface card.

In this embodiment, the server 10 may include a baffle 950. The baffle 950 is located in the third accommodation space S3, and the baffle 950 has a plurality of engagement structures 951 located at one side of the baffle 950 and a support structure 952 located at another side of the baffle 950. The engagement structures 951 are engaged with the fan assembly 300, and the support structure 952 is in contact with the circuit board 410 of the host assembly 400 so as to fix the baffle 950 above the circuit board 410 of the host assembly 400. Since the space below the baffle 950 is substantially occupied by the circuit board 410 of the host assembly 400, it is difficult to arrange structures fixing the baffle 950 at the space below the baffle 950. Therefore, the baffle 950 is fixed to the fan assembly 300 via the engagement structures 951 and is in contact with the circuit board 410 of the host assembly 400 via the support structure 952, which facilitates the installation or removal of the baffle 950 and remains a sufficient room on the circuit board 410 for cable arrangements.

In this embodiment, the first disk drive assembly 200, the fan assembly 300, the host assembly 400, the first expansion card assembly 500, the second expansion card assembly 600, the power supply assembly 700, the second disk drive assembly 800, and the baffle 950 are fixed in position via thumb screws (not shown), which facilitates the installations or removals thereof.

According to the server as discussed in the above embodiment, the casing has three spaces, and those spaces respectively accommodate the first disk drive assembly, the fan assembly, the host assembly, the expansion card assemblies, the power supply assembly, and the second disk drive assembly, such that the server provides a desirable performance.

In addition, the baffle is fixed to the fan assembly via the engagement structures and, which facilitates the installation or removal of the baffle and remains a sufficient room on the circuit board for cable arrangements.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server, comprising:
   a casing, having a first accommodation space, a second accommodation space, and a third accommodation space, wherein the second accommodation space is located between the first accommodation space and the third accommodation space;
   a first disk drive assembly, located in the first accommodation space;
   a fan assembly, located in the second accommodation space;
   a host assembly, located in the third accommodation space;

a first expansion card assembly and a second expansion card assembly, located in the third accommodation space and located above the host assembly;

a power supply assembly, located in the third accommodation space, wherein the second expansion card assembly is located between the first expansion card assembly and the power supply assembly; and a second disk drive assembly, located in the third accommodation space, wherein the second disk drive assembly is located between the power supply assembly and the second expansion card assembly;

wherein the server further comprises a network interface card assembly, the network interface card assembly is located in the third accommodation space and located below the second disk drive assembly.

2. The server according to claim 1, wherein the second disk drive assembly comprises four U.2 disk drives, and the network interface card assembly comprises a OCP3.0 network interface card.

3. The server according to claim 1, further comprising a baffle, wherein the baffle is located in the third accommodation space, one side of the baffle is engaged with the fan assembly, and another side of the baffle is in contact with the host assembly.

4. The server according to claim 1, wherein the first disk drive assembly comprises twenty-four 3.5-inch hard disk drives, the 3.5-inch hard disk drives are arranged in two layers, and each of the two layers comprises twelve hard disk drives.

5. The server according to claim 4, further comprising two trays, wherein the two trays are slidably located in the first accommodation space of the casing, and the 3.5-inch hard disk drives of the two layers are respectively disposed on the two trays.

6. The server according to claim 1, wherein the first expansion card assembly comprises a full-height expansion card, and the second expansion card assembly comprises a half-height expansion card.

7. The server according to claim 1, wherein the host assembly comprises a circuit board, a plurality of electronic components, and a plurality of fan connectors, the plurality of electronic components are disposed on the circuit board, and the plurality of fan connectors are disposed on the circuit board.

8. The server according to claim 1, wherein the power supply assembly comprises two backup power supplies, and the two backup power supplies are stacked on each other.

9. The server according to claim 1, wherein a height of the casing is 2U.

* * * * *